(12) United States Patent
Voutilainen

(10) Patent No.: US 10,819,313 B2
(45) Date of Patent: Oct. 27, 2020

(54) APPARATUS AND METHOD FOR TUNING A RESONANCE FREQUENCY

(71) Applicant: LytEn, Inc., Sunnyvale, CA (US)

(72) Inventor: Martti Voutilainen, Espoo (FI)

(73) Assignee: Lyten, Inc., Sunnyvale, CA (US)

( * ) Notice: Subject to any disclaimer, the term of this patent is extended or adjusted under 35 U.S.C. 154(b) by 757 days.

(21) Appl. No.: 14/774,471

(22) PCT Filed: Mar. 11, 2013

(86) PCT No.: PCT/FI2013/050264
§ 371 (c)(1),
(2) Date: Sep. 10, 2015

(87) PCT Pub. No.: WO2014/140409
PCT Pub. Date: Sep. 18, 2014

(65) Prior Publication Data
US 2016/0028374 A1    Jan. 28, 2016

(51) Int. Cl.
*H03J 1/06* (2006.01)
*H01L 41/193* (2006.01)
(Continued)

(52) U.S. Cl.
CPC .............. *H03J 1/06* (2013.01); *H01L 41/193* (2013.01); *H01Q 1/50* (2013.01); *H03H 3/02* (2013.01);
(Continued)

(58) Field of Classification Search
CPC .................. H01L 41/193; H03H 9/02244
See application file for complete search history.

(56) References Cited

U.S. PATENT DOCUMENTS 8,803,406 B2    8/2014 Lee et al.
2002/0182091 A1  12/2002 Potter
(Continued)

FOREIGN PATENT DOCUMENTS

CN    102315831      1/2012
JP    2004-007352 A  1/2004
(Continued)

OTHER PUBLICATIONS

Office action received for corresponding Japanese Patent Application No. 2015-562270, dated Aug. 18, 2017, 4 pages of office action and 5 pages of office action translation available.
(Continued)

*Primary Examiner* — Thomas M Dougherty
*Assistant Examiner* — Karen B Addison
(74) *Attorney, Agent, or Firm* — Paradice & Li LLP

(57) ABSTRACT

There are disclosed various apparatuses and methods for tuning a resonance frequency. In some embodiments there is provided an apparatus (200) comprising at least one input electrode (202, 204) for receiving radio frequency signals; a graphene foil (210) for converting at least part of the radio frequency signals into mechanical energy; at least one dielectric support element (212) to support the graphene foil (210) and to space apart the at least one input electrode (202, 204) and the graphene foil (210). The graphene foil (210) has piezoelectric properties. In some embodiments there is provided a method comprising receiving radio frequency signals by at least one input electrode (202, 204) of an apparatus (200); providing a bias voltage to the apparatus (200) for tuning the resonance frequency of the apparatus (200); and converting at least part of the radio frequency signals into mechanical energy by a graphene foil (210) having piezoelectric properties.

20 Claims, 10 Drawing Sheets

(51) Int. Cl.
H03H 9/02 (2006.01)
H03H 9/70 (2006.01)
H01Q 1/50 (2006.01)
H03H 3/02 (2006.01)
H03H 9/24 (2006.01)
H03H 9/46 (2006.01)
H03H 9/15 (2006.01)

(52) U.S. Cl.
CPC .... *H03H 9/02244* (2013.01); *H03H 9/02409* (2013.01); *H03H 9/2436* (2013.01); *H03H 9/2457* (2013.01); *H03H 9/2463* (2013.01); *H03H 9/462* (2013.01); *H03H 9/70* (2013.01); *H03H 2003/027* (2013.01); *H03H 2009/155* (2013.01)

(56) References Cited

U.S. PATENT DOCUMENTS

| 2003/0112096 | A1 | 6/2003 | Potter |
| 2004/0023236 | A1 | 2/2004 | Potter et al. |
| 2011/0014457 | A1* | 1/2011 | Quitoriano ............ C01B 32/182 428/336 |
| 2012/0133247 | A1* | 5/2012 | Lee ...................... H01L 41/183 310/339 |
| 2013/0234559 | A1* | 9/2013 | Ermolov ............... H01L 41/047 310/321 |

FOREIGN PATENT DOCUMENTS

| JP | 2007-202171 A | 8/2007 |
| KR | 2012-0005751 A | 1/2012 |
| KR | 20120058710 | 6/2012 |
| WO | 2012069882 | 5/2012 |

OTHER PUBLICATIONS

Office action received for corresponding Chinese Patent Application No. 201380076480.3, dated Apr. 6, 2017, 7 pages of office action and no pages of office action translation available.

International Search Report and Written Opinion received for corresponding Patent Cooperation Treaty Application No. PCT/FI2013/050264, dated Nov. 22, 2013, 14 pages.

Ong, M.T. et al. "Engineered piezoelectricity in graphene", ACS Nano, 2012, vol. 6, No. 2, pp. 1387-1394.

Ong, M. T. et al. "The effect of hydrogen and fluorine coadsorption on the piezoelectric properties of graphene", Jounral of Physical Chemistry C, Jan. 2013, vol. 117, No. 7, pp. 3615-3620.

Bunch J.S. et al. "Electromechanical resonators from graphene sheets", Science, Jan. 2007, vol. 315, No. 5811, pp. 490-493.

Office action received for corresponding Japanese Patent Application No. 2015-562270, dated Jan. 20, 2017, 3 pages of office action and 4 pages of office action translation available.

Piazza et al., "Piezoelectric Aluminum Nitride Vibrating Contour-Mode MEMS Resonators", Journal of Microelectromechanical Systems, vol. 15, No. 6, Dec. 2006, pp. 1406-1418.

Penunuri et al., "RF Filter Design Using LTCC and Thin Film BAW technology", IEEE Ultrasonics Symposium, Oct. 7-10, 2001, 6 pages.

Ruby et al., "PCS 1900 MHz Duplexer Using Thin Film Bulk Acoustic Resonators (FBARs)", Electronics Letters, vol. 35, No. 10, May 13, 1999, pp. 794-795.

"Engineering of Graphene Gives it Piezoelectric Properties", IEEE Spectrum, Retrieved on Oct. 11, 2016, Webpage available at : http://spectrum.ieee.org/nanoclast/semiconductors/nanotechnology/engineering-of-graphene-gives-it-piezoelectric-properties.

Chandratre et al., "Coaxing graphene to be piezoelectric", Applied Physics Letters, vol. 100, No. 2, Jan. 13, 2012, pp. 1-3.

Koester, "Using the Quantum Capacitance in Graphene to Enable Varactors for Passive Wireless Sensing Applications", IEEE Sensors, Oct. 28-31, 2011, pp. 1-3.

Stratton et al., "A MEMS-based quartz resonator technology for GHz applications", Proceedings of the 2004 IEEE International Frequency Control Symposium and Exposition, 2004, pp. 27-34.

Serrano et al., "Electrostatically Tunable Piezoelectric-on-Silicon Micromechanical Resonator for Real-time Clock", IEEE Transactions on Ultrasonics, Ferroelectrics, and Frequency Control, vol. 59, No. 3, Mar. 2012, pp. 358-365.

Olivares et al., "Tunable Mechanical Resonator With Aluminum Nitride Piezoelectric Actuation", Proceedings of SPIE—The International Society for Optical Engineering, vol. 6186, Apr. 2006, 12 pages.

Hung et al., High-Q Low-Impedance MEMS Resonators, Berkeley EECS, Technical Report No. UCB/EECS-2012-218, Dec. 1, 2012, 155 pages.

Wei et al., "The nature of strength enhancement and weakening by pentagon-heptagon defects in graphene", Nature Materials, vol. 11, Jul. 1, 2012, pp. 759-763.

Reina et al., "Large Area, Few-Layer Graphene Films on Arbitrary Substrates by Chemical Vapor Deposition", Nano Letters, vol. 9, No. 1, Dec. 1, 2008, pp. 30-35.

Perebeinos et al., "Phonon-Mediated Interlayer Conductance in Twisted Graphene Bilayers", Physical review letters, Dec. 7, 2012, 10 pages.

Zhang et al., "Nitrogen Doping of Graphene and Its Effect on Quantum Capacitance, and A New Insight on the Enhanced Capacitance of N-doped Carbon", Energy & Environmental Science, No. 11, Sep. 2012, pp. 9618-9625.

"Engineered Piezoelectricity in Graphene + H, F", Stanford University, Retrieved on Oct. 12, 2016, Webpage available at : http://web.stanford.edu/group/evanreed/research/gHF.html.

"Final report on graphene resonator applications in radiofront end and transceiver based on RODIN results", RODIN Suspended Graphene Nanostructures, Version 1.0, Oct. 1, 2010, pp. 1-17.

"Piezoelectric properties of graphene oxide from the first-principles calculations", Materials Science, Apr. 6, 2014, pp. 1-10.

Extended European Search Report received for corresponding European Patent Application No. 13877847.7, dated Oct. 6, 2016, 6 pages.

* cited by examiner

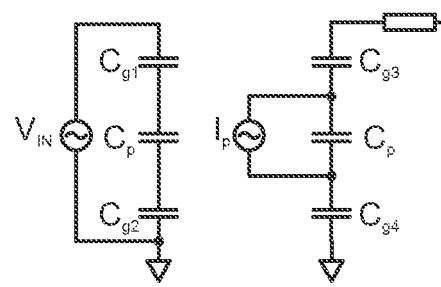
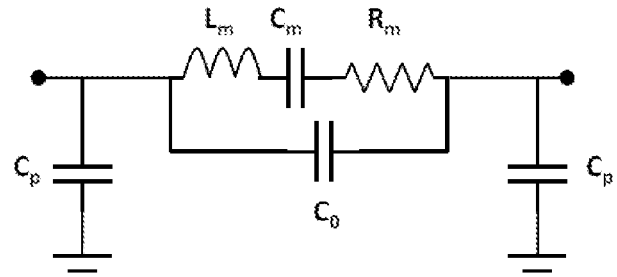
Fig. 9a                    Fig. 9b
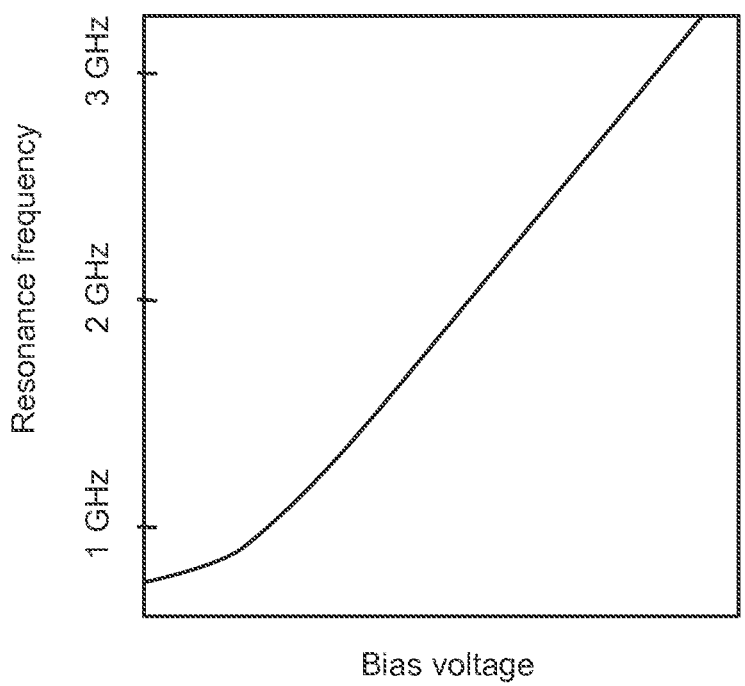
Fig. 10

APPARATUS AND METHOD FOR TUNING A RESONANCE FREQUENCY

RELATED APPLICATION

This application was originally filed as PCT Application No. PCT/FI2013/050264 filed Mar. 11, 2013.

TECHNICAL FIELD

The present invention relates to an apparatus for tuning a resonance frequency of a resonator. The invention further relates to a method for tuning a resonance frequency of a resonator.

BACKGROUND

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

A modern radio telecommunication environment is very diverse with the use of numerous radio communication schemes, both standard and nonstandard. User devices may be equipped with capabilities to communicate through multiple different radio communication schemes, e.g. GSM, GPRS/EDGE, Bluetooth, WLAN, UMTS and its evolution versions HSDPA, LTE and LTE-A. Additionally, concepts like cognitive radio or software-defined radio (SDR) may be implemented in the user devices in the future. Cognitive radio is a general concept to denote radio devices that are able to sense a radio environment and to select a radio communication scheme and radio communication parameters that may be the most suitable for the sensed radio environment.

In a mobile transceiver a front-end module (FEM) provides means to connect one or more antennas to one or more multiple system transceiver engines. Switches and filters may provide some frequency selectivity with connected wide/multiband antennas.

When more and more systems are to be added to the mobile devices the loss, size and/or cost penalty of current solutions may increase rapidly to the point when the current way may not be applicable.

SUMMARY

Some embodiments utilize the use of graphene based filters having piezoelectric properties. In some embodiments the idea is to form an electromechanical element from graphene and modify the graphene material in such a way that it provides piezoelectric properties. Hence, such a filter may be used e.g. as a filter for radio frequency signals, as a resonator for oscillators etc.

Various aspects of examples of the invention are provided in the detailed description.

According to a first aspect, there is provided an apparatus comprising:
at least one input electrode and a second input electrode for receiving radio frequency signals;
a graphene foil for converting at least part of the radio frequency signals into mechanical energy;
at least one dielectric support element to support the graphene foil and to space apart the at least one input electrode and the graphene foil;
wherein the graphene foil has piezoelectric properties.

According to a second aspect, there is provided a method comprising:
providing at least one input electrode for receiving radio frequency signals;
providing a graphene foil for converting at least part of the radio frequency signals into mechanical energy;
providing at least one dielectric support element to support the graphene foil and spacing apart the at least one input electrode and the graphene foil;
wherein the graphene foil has piezoelectric properties.

According to a third aspect, there is provided an apparatus comprising:
means for providing at least one input electrode for receiving radio frequency signals;
means for providing a graphene foil for converting at least part of the radio frequency signals into mechanical energy;
means for providing at least one dielectric support element to support the graphene foil and spacing apart the at least one input electrode and the graphene foil;
wherein the graphene foil has piezoelectric properties.

According to a fourth aspect, there is provided an apparatus comprising:
a control element for selecting a frequency band for reception;
an antenna for receiving radio frequency signals;
a bandpass filter for filtering radio frequency signals within the selected frequency band for further processing, the bandpass filter comprising a micromechanical resonator having:
at least one input electrode for receiving the radio frequency signals from the antenna;
a graphene foil having piezoelectric properties for converting at least part of the radio frequency signals into mechanical energy;
at least one dielectric support element to support the graphene foil and to space apart the at least one input electrode and the graphene foil;
wherein the apparatus is adapted to provide a bias voltage to the micromechanical resonator for tuning the resonance frequency of the micromechanical resonator to correspond with the selected frequency band.

By utilizing the graphene based piezoelectric filter only one or a few filters may be needed to support many mobile communication systems (bands). Furthermore, such filter or filters may be integrated quite easily.

BRIEF DESCRIPTION OF THE DRAWINGS

For a more complete understanding of example embodiments of the present invention, reference is now made to the following descriptions taken in connection with the accompanying drawings in which:

FIG. 5b illustrates a cross section of the micromechanical resonator of FIG. 5a;

FIG. 6b illustrates a cross section of the micromechanical resonator of FIG. 6a;

FIG. 7b illustrates a cross section of the micromechanical resonator of FIG. 7a;

FIG. 8b illustrates a cross section of the micromechanical resonator of FIG. 8a;

FIG. 9a shows an equivalent electrical circuit of the micromechanical resonator according to an example embodiment;

FIG. 9b shows an equivalent electrical circuit of a capacitive piezo resonator according to an example embodiment; and FIG. 10 shows an example of bias voltage-bandpass frequency dependency of a micromechanical resonator of an example embodiment.

DETAILED DESCRIPTION OF SOME EXAMPLE EMBODIMENTS

Figure 1:
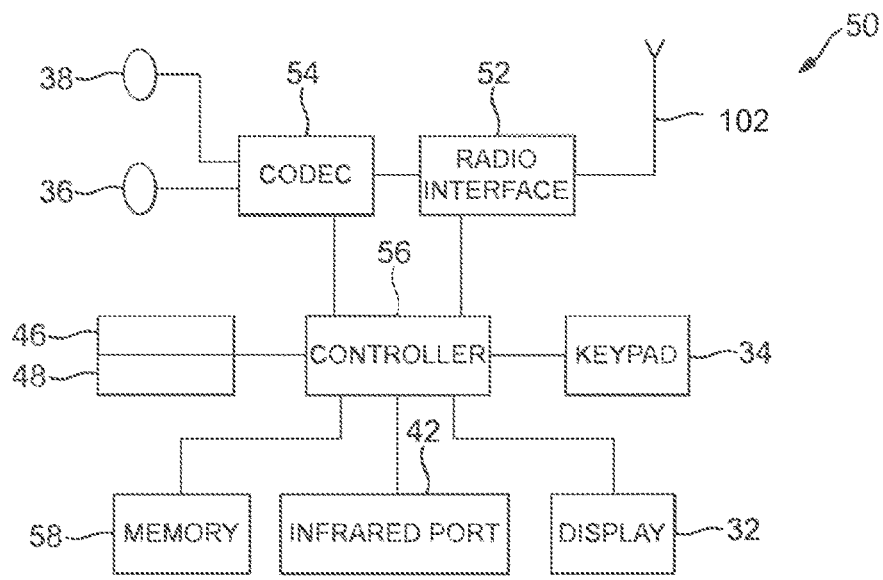
FIG. 1 shows a block diagram of an apparatus according to an example embodiment.

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

Currently band selection using one antenna may be made with digitally controlled switches which define the filters and "pipes" to be used. That is fixed approach and without fine tuning or component variation compensation. This may not be a problem with few frequencies and system bands but increasing amount of bands/systems may cause this approach to fail. The antenna matching fine tuning and component variation compensation might be on the other hand handled with separate circuitry and logic. These front end tuners may suffer from complexity (cost and size issues) as well from fairly moderate performance.

Frequency filters may be used in radio circuits to select intended frequency band for transmission and/or receiving. In many embodiments piezoelectric filters that have changeable fundamental frequency may be used. In radio-frequency (RF) filters and frequency reference elements for e.g. consumer electronics like mobile devices and other wireless communication devices size, power consumption, and price may need to be taken into consideration to make single-chip integrated RF solutions possible so that communication devices may support different frequency bands of different communication systems with as few filters as possible.

A piezoelectric resonator is one type of electrostatically transduced micromechanical resonators in which a small plate-like element transforms varying electrical signals into mechanical vibrations i.e. the plate-like element begins to vibrate. When the frequency of the electrical signal is near the resonance frequency of the micromechanical resonator the micromechanical resonator represents a much smaller impedance to the electrical signal compared to signals having frequency further away from the resonance frequency. Hence, the mechanical resonator may be used as a band-pass filter, for example.

Micromechanical resonators are an example of micro-electromechanical systems (MEMS) or nano-electromechanical systems (NEMS) depending e.g. the dimensions of the resonator.

One implementation restriction for many electrostatically transduced micromechanical resonators may be that they exhibit large values of motional resistance, even hundreds of $k\Omega$s, which may complicate the interfacing of these electrostatic devices to RF systems having e.g. about $50\Omega$ impedance and to antennas that may represent only about $10\Omega$ impedance level.

In some embodiments the above mentioned implementation restrictions may be reduced or eliminated by utilizing graphene in the resonator. In some embodiments the graphene is made piezoelectric, wherein the piezoelectric graphene based resonator may be used as a frequency filter in radio communications, especially but not limited to, in a front end between a power amplifier (PA) or a transmitter and an antenna and/or between a low-noise amplifier of a receiver and an antenna.

Figure 5A:
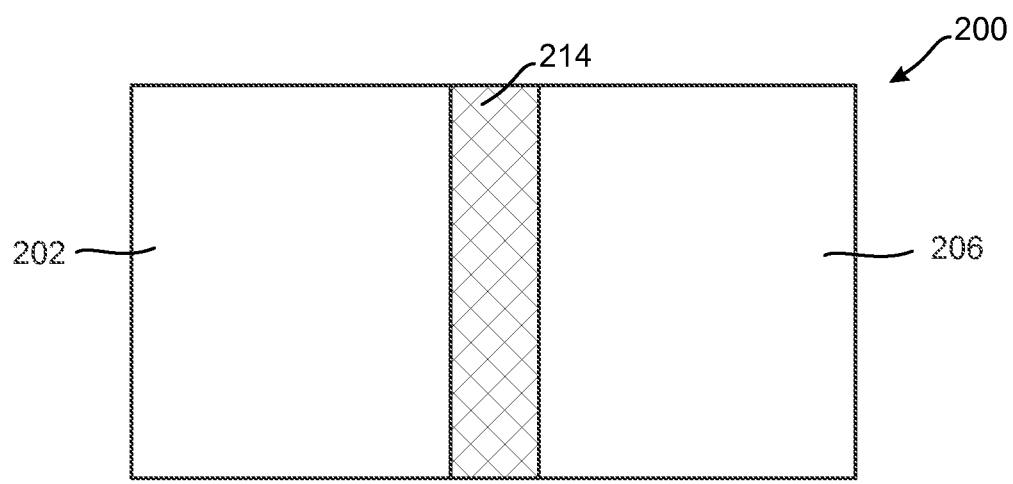
FIG. 5a illustrates as a top view of an example of a micromechanical resonator according to an example embodiment.

In the following some example embodiments of the micromechanical resonator containing graphene are described in more detail with reference to FIGS. 5a-8b. In FIG. 5a an example embodiment of the micromechanical resonator 200 is illustrated as a top view and on FIG. 5b a cross section A-A of the micromechanical resonator 200 of FIG. 5a is illustrated. The micromechanical resonator 200 comprises input electrodes 202, 204 for receiving electrical signals and output electrodes 206, 208 for outputting electrical signals which pass the micromechanical resonator 200 and/or are generated by the micromechanical resonator 200. The micromechanical resonator 200 further comprises a graphene foil 210 located between the input electrodes 202, 204 and between the output electrodes 206, 208. In this embodiment the graphene foil 210 is not in electric contact with the electrodes 202-208 but is isolated from them. The isolation may be made e.g. by dielectric supports 212 located between each of the electrodes 202-208 and the graphene foil 210 as can be seen from FIG. 5b. Hence, the dielectric supports 212 space apart the input electrodes and the graphene foil, wherein a gap is formed between the electrodes 202-208 and the graphene foil 210. It should be noted here that the gap between the first input electrode 202 and the graphene foil 210 and the gap between the second input electrode 204 and the graphene foil 210 need not be equal but may be different from each other. Correspondingly, the gap between the first output electrode 206 and the graphene foil 210 and the gap between the second output electrode 208 and the graphene foil 210 need not be equal but may be different from each other. In some embodiments the gap between the first input electrode 202 and the graphene foil 210 and the gap between the first output electrode 206 and the graphene foil 210 is substantially the same and/or the gap between the second input electrode 204 and the graphene foil 210 and the gap between the second output electrode 208 and the graphene foil 210 is substantially the same to avoid bending the graphene foil 210.

The electrodes 202-208 may also be made of graphene or metal or both graphene and metal.

The micromechanical resonator 200 may also be provided with optional dielectric shields 214 between the graphene foil 210 and the electrodes 202-208. The dielectric shields 214 may be positioned between the dielectric supports 212 and the electrodes 202-208 so that the dielectric shields 214 do not touch the graphene foil 210 when the graphene foil 210 is in rest i.e. does not vibrate. One purpose of the dielectric shields 214 is to prevent short-circuits between the graphene foil 210 and the electrodes 202-208 when the graphene foil is vibrating. Namely, the electrodes 202-208 may not have completely planar (smooth) surface but may be uneven wherein the distance (gap) between the graphene foil 201 and the electrodes 202-208 may be different in different locations. Another purpose of the dielectric shields 214 is to form the volume defined by the graphene foil 210 and the dielectric supports 212 gastight wherein a vacuum may be arranged in the volume. The vacuum may improve the electromechanical properties of the micromechanical resonator 200.

The attachment of the graphene foil 210 between the dielectric supports 212 may be implemented in such a way that the graphene foil 210 remains under pressure between the dielectric supports 212. The pressure may reduce distance between the first input electrode 202 and the second input electrode 204 as well as the distance between the first output electrode 206 and the second output electrode 208. The pressure may further increase mechanical conversion efficiency of the micromechanical resonator 200 and change the graphene foil 210 to piezoelectric.

There are different kinds of methods to make the graphene foil 210 piezoelectric. For example, the graphene foil 210 may be machined mechanically so that holes are formed through the graphene foil 210 at determined locations. In some embodiments the holes are triangular but also other forms may be used. Furthermore, the machining need not be mechanical but the holes may be achieved by other suitable methods such as etching.

In addition to or instead of the mechanical machining the graphene foil 210 may be treated chemically. For example, the graphene foil 210 may be doped with certain kind of atoms to induce the piezoelectricity to the graphene foil 210. For example, lithium, hydrogen, potassium and/or fluorine may be deposited on one side or on both sides of the graphene foil 210. The piezoelectric properties of the graphene foil 210 may further be affected by pattern doping in which atoms are placed selectively in specific locations whereas other locations of the graphene foil 201 leave undoped.

The above described treatment of the graphene foil 210 may improve impedance matching of the micromechanical resonator 200 to e.g. 50Ω circuits due to the increased electromechanical coupling. Therefore, such micromechanical resonators 200 may be used in a front end of a transmitter and/or a receiver e.g. as a filter between an antenna and an amplifier.

Figure 5B:
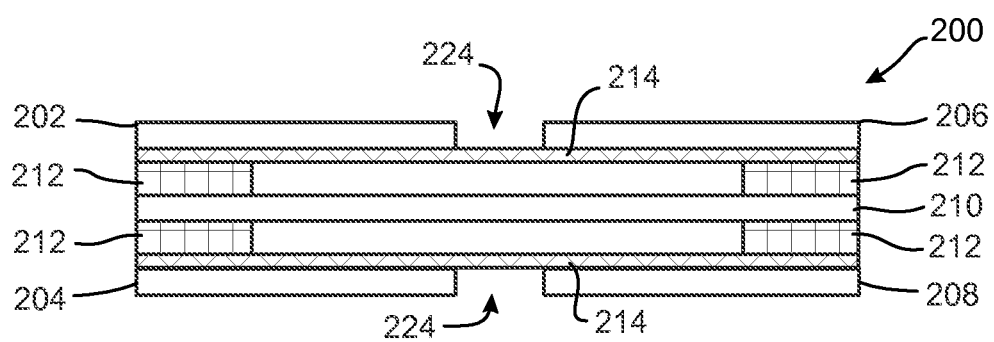

The operation of the example micromechanical resonator 200 of FIGS. 5a and 5b may be as follows. When an electric signal is input to the input electrodes 202, 204, the electric signal induces an electric field between the input electrodes 202, 204. This electric field causes that the graphene foil 210 changes its shape or bends. The graphene foil 210 has a certain spring rate depending inter alia on the dimensions and piezoelectric properties of the graphene foil 210. The graphene foil 210 has a resonance frequency in which the graphene foil 210 tends to vibrate. When the frequency of the input signal is near the resonance frequency of the graphene foil 210, the graphene foil 210 begins to vibrate at that frequency. In other words, the electric signal is transformed into mechanical movement. The vibrations of the graphene foil 210 induce an electric field between the output electrodes 206, 208 which alternates at the frequency of the vibration of the graphene foil 210. The generated electric signal at the output electrodes 206, 208 may be supplied to further stages of a device.

It should be mentioned here that in some embodiments the electric signal need not be input to both input electrodes 202, 204 but only to one of them, wherein the other input electrode may be connected e.g. to a common ground, to 0 V or to some other potential. Correspondingly, the generated electric signal may be output from one of the output electrodes 206, 208 and the other output electrode may be connected e.g. to the common ground, to 0 V or to some other potential.

If the frequency of the input signal is far from the resonance frequency, the graphene foil 210 does not begin to vibrate or the vibrations are smaller compared to the situation in which the frequency is near the resonance frequency, wherein no electric signals or only very weak electric signals are generated between the output electrodes 206, 208. Hence, the mechanical resonator 200 passes through electric signals which are near the resonance frequency and blocks or attenuates other signals. This kind of operation may be called as band-pass filtering. The sharpness of the band pass may depend on inter alia the Q-factor of the micromechanical resonator in such a way that the higher the Q-value the steeper the edges of the band pass.

The resonance frequency of the micromechanical resonator 200 may be affected by applying a substantially constant electric field over the graphene foil 210. This may be performed e.g. by supplying a bias voltage to the input electrodes 202, 204 in addition to the input signal. The level of the bias voltage may then be used to tune the resonance frequency to an appropriate value. The bias voltage causes that the capacitance in the metal-insulator-graphene structure of the micromechanical resonator varies with a charge concentration through a quantum capacitance effect in the structure.

Because the fundamental (resonance) frequency may be changed by electric field (t) a single filter or a small number of filters may be sufficient to implement a front end of a mobile communication device capable of operating in several radio communication bands. It is also possible to match the impedance to 50Ω circuits wherein a separate impedance matching circuitry may not be needed. Furthermore, the micromechanical resonator 200 has a Q-value high enough for efficient filter use, i.e. filter is selective enough.

An equivalent circuit of the micromechanical resonator is described in FIG. 10. In FIG. 10 the resistance $R_m$, the capacitance $C_m$ and the inductance $L_m$ can be expressed with following formulas, respectively:

$$R_m = \frac{\gamma}{\eta^2} = \frac{\sqrt{km}}{Q\eta^2} \qquad (1)$$

$$C_m = \frac{\eta^2}{k}$$

$$L_m = \frac{m}{\eta^2}$$

where k and m are effective spring constant and mass, respectively, which depend on the structure of the resonator and η is the electromechanical transduction factor. The transduction factor η may be defined as follows:

$$\eta = \frac{u_{dc}\varepsilon A_{el}}{d^2} \quad (2)$$

where $u_{dc}$ is the bias voltage, Ael is the electrode area (assuming a plate structure), ∈ is the dielectric constant and d is the initial electrode gap that is minimized by mechanical pressure of the electrodes 202-208.

In some embodiments two or more micromechanical resonators may be combined e.g. connecting them in series or in parallel. In yet some embodiments both series connection and parallel connection may be used. As an example, two micromechanical resonators having a slightly different band pass frequencies may be connected in series. In this kind of connection the band pass of the combination may be wider than the band pass of the individual micromechanical resonators which may be benefited in some implementations.

Figure 6A:
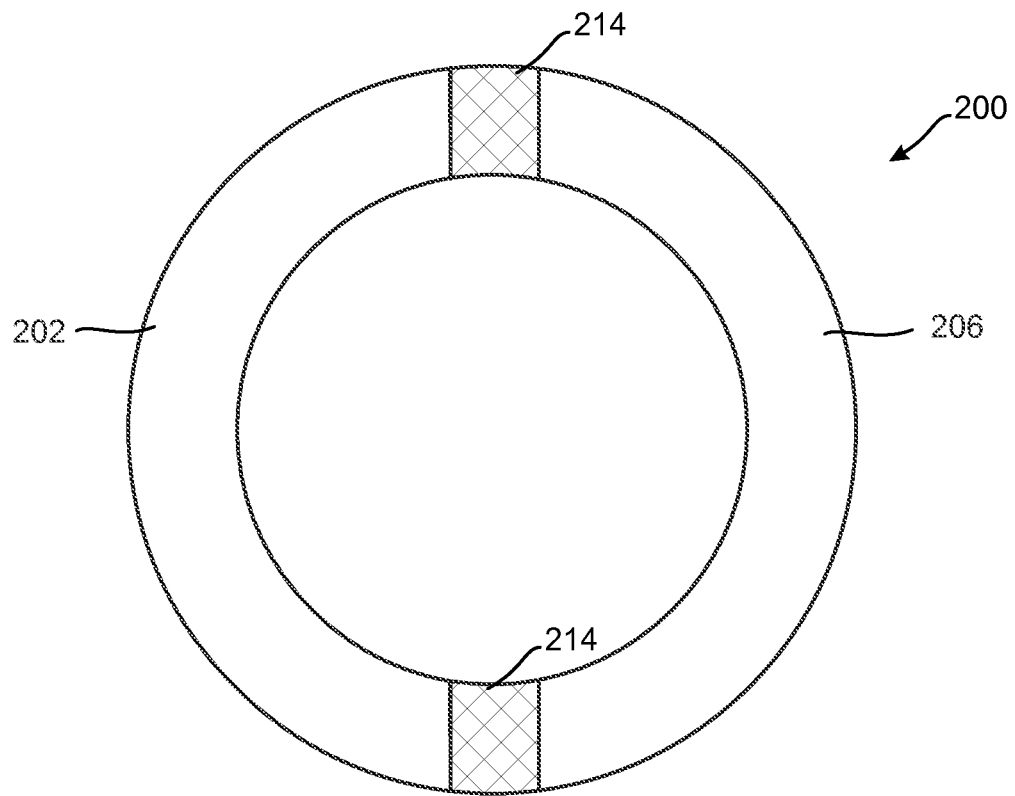
FIG. 6a illustrates as a top view of an example of a micromechanical resonator according to another example embodiment.
Figure 6B:
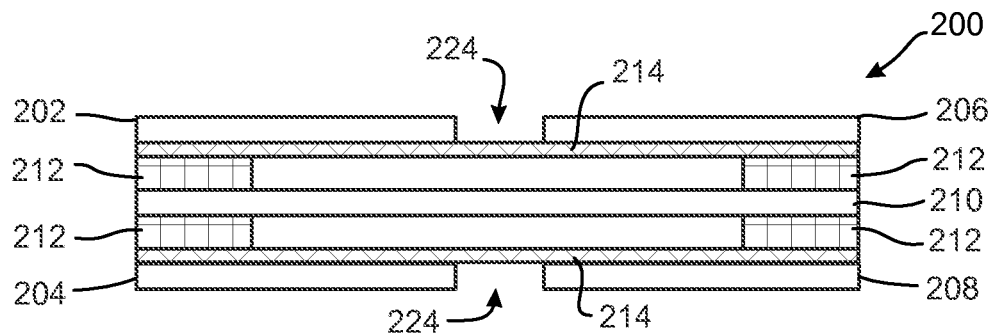

In the following some other example embodiments of the micromechanical resonator will be described in more detail. FIG. 6a illustrates as a top view of an example of a micromechanical resonator according to another example embodiment and FIG. 6b illustrates a cross section of the micromechanical resonator of FIG. 6a. In this embodiment the micromechanical resonator 200 has a ring-like shape wherein a first half of the ring comprises the input section 220 of the micromechanical resonator 200 and a second half of the ring comprises the output section 222 of the micromechanical resonator 200. The input section 220 and the output section 222 are separated with a gap 224 as was the case in the example embodiment of FIGS. 5a and 5b.

Figure 7A:
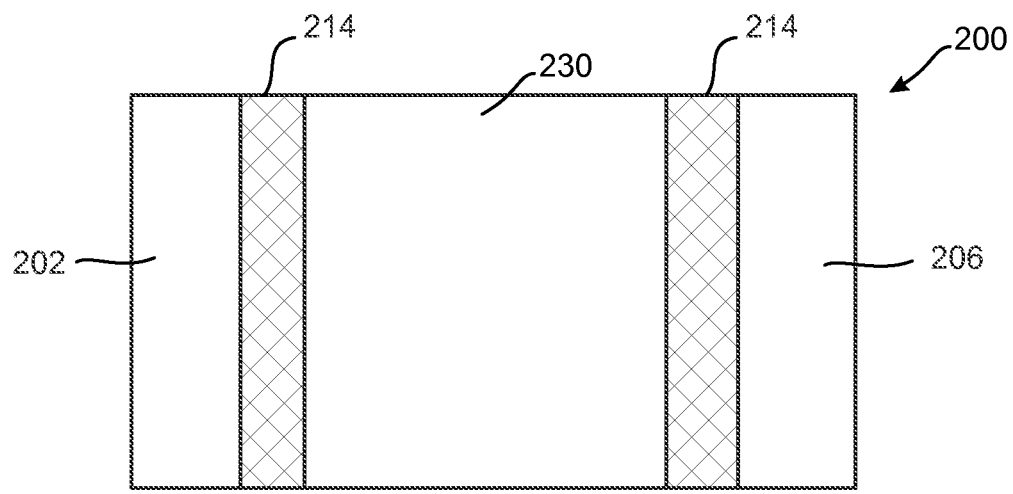
FIG. 7a illustrates as a top view of an example of a micromechanical resonator according to yet another example embodiment.
Figure 7B:
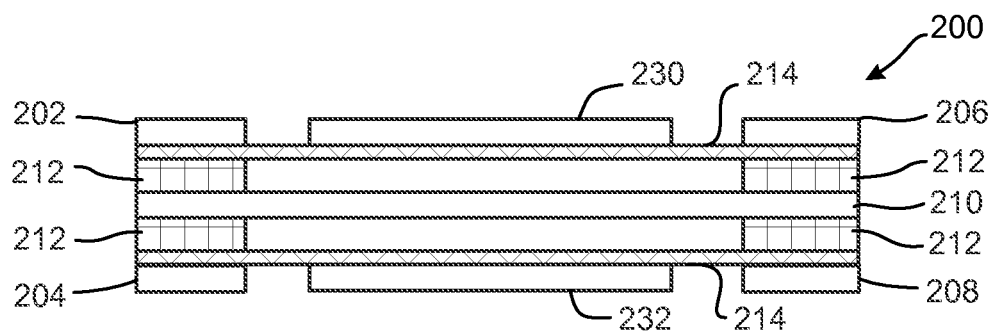

FIG. 7a illustrates as a top view of an example of a micromechanical resonator according to yet another example embodiment and FIG. 7b illustrates a cross section of the micromechanical resonator of FIG. 7a. In this embodiment the micromechanical resonator 200 resembled the structure of the micromechanical resonator 200 of FIGS. 5a and 5b except that the micromechanical resonator 200 also comprises bias electrodes 230, 232 between the input electrodes 202, 204 and the output electrodes 206, 208. One purpose of the bias electrodes 230, 232 is to provide bias voltage to the micromechanical resonator 200. Hence, the input signal and the bias voltage can be kept separate from each other, which may make easier to control the bias voltage and may also enable to use higher bias voltages than without using separate bias electrodes 230, 232. In this embodiment the frequency tuning range may also be larger than with embodiments in which the bias voltage is provided through the input electrodes 202, 204 or through the output electrodes 206, 208.

It should be mentioned here that in some embodiments the bias voltage need not be input to both bias electrodes 230, 232 but only to one of them, wherein the other bias electrode may be connected e.g. to a common ground, to 0 V or to some other potential.

Figure 8A:
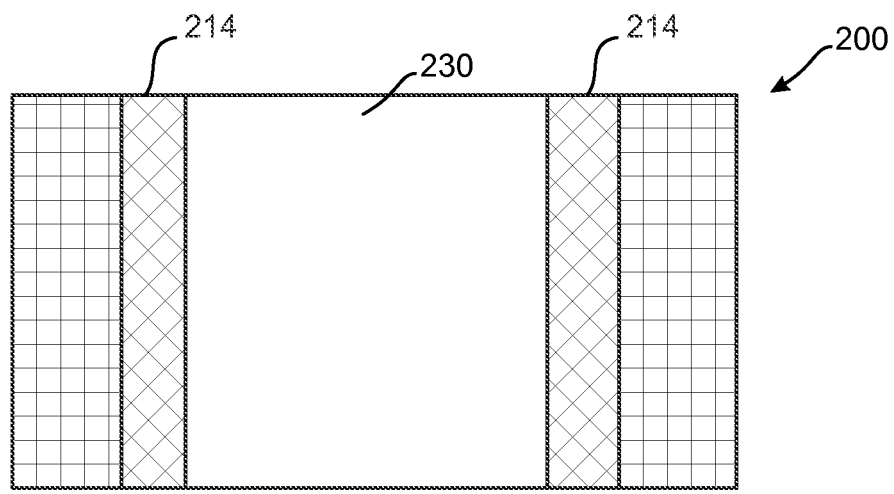
FIG. 8a illustrates as a top view of an example of a micromechanical resonator according to still another example embodiment.
Figure 8B:
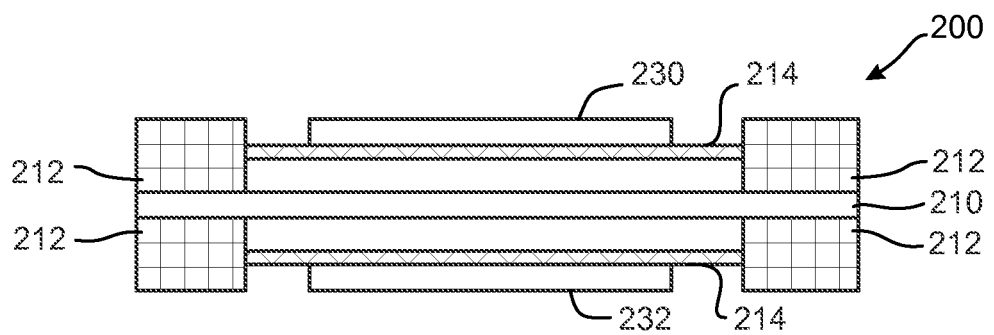

FIG. 8a illustrates as a top view of an example of a micromechanical resonator according to still another example embodiment and FIG. 8b illustrates a cross section of the micromechanical resonator of FIG. 8a. In this embodiment bias electrodes 230, 232 may also be used as signal electrodes. The micromechanical resonator 200 of this embodiment does not have output electrodes, wherein the micromechanical resonator 200 may be used e.g. as a vibrating element (a crystal) of an oscillator, as a notch filter etc.

Figure 8C:
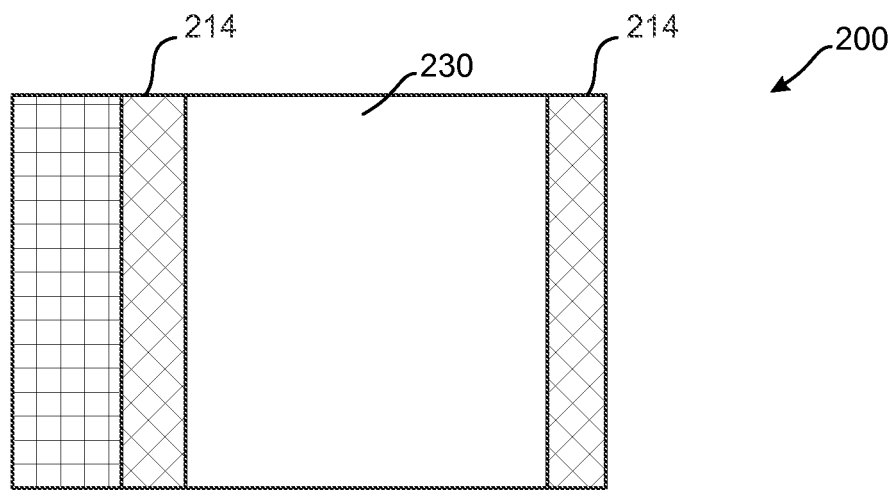
FIG. 8c illustrates as a top view of an example of a micromechanical resonator modified from the micromechanical resonator of FIGS. 8a and 8b.
Figure 8D:
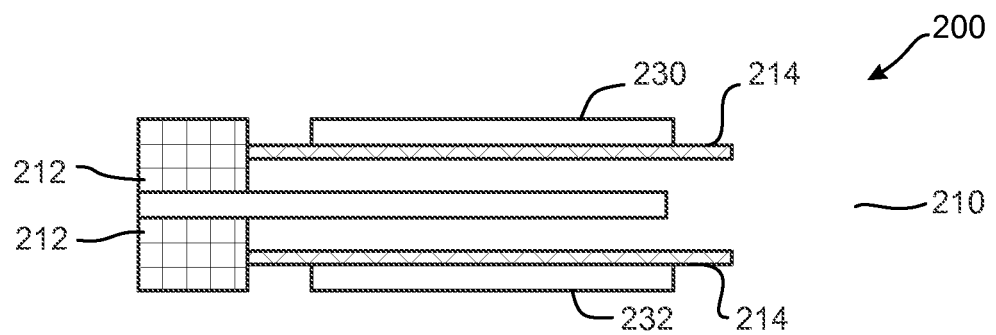
FIG. 8d illustrates a cross section of the micromechanical resonator of FIG. 8c.

FIGS. 8c and 8d illustrate a modification of the example of FIGS. 8a and 8b as a top view and a cross sectional view, respectively. In this modification the graphene foil 210 is only supported at one edge wherein the other edge is unsupported. This may make the vibrations of the graphene foil 210 less restricted compared to the embodiments in which the graphene foil 210 is supported at two opposite edges.

In the embodiments of FIGS. 8a-8d the dielectric supports 212 and the dielectric shields 214 above the graphene foil 210 and, respectively, the dielectric supports 212 and the dielectric shields 214 below the graphene foil 210 may be formed of the same material and can be one piece (i.e. one piece above the graphene foil 210 and another piece below the graphene foil 210) or they may be formed as separate elements which may then be combined to form the dielectric insulation and support for the structure as is illustrated in FIGS. 8b and 8d.

The above described example embodiments are only illustrative, non-limiting examples of the structures and shapes which may be used when implementing the micromechanical resonator comprising a graphene foil 210. The shape may differ from rectangular or ring form. For example, the shape may resemble a closed circle (i.e. without the hole in the centre of the circle), an ellipse, a triangle, etc.

The graphene foil 210 may comprise one layer of graphene (a monolayer graphene foil) or multiple layers of graphene (a multilayer graphene foil), for example two, three, four or more than four layers.

Also the dimensions of the micromechanical resonator 200 may be different in different implementations. In some embodiments the length and width of the micromechanical resonator 200 may be a few micrometers, some tens of micrometers, some hundreds of nanometers, etc. The gap between the graphene foil 210 and the dielectric shields 214 may be a few nanometers, e.g. less than 50 nm, for example between 40 and 50 nm, less than 40 nm, or even less than 10 nm, for example 5 nm. Such a small gaps are possible because the surface of the graphene foil 210 is quite smooth compared to piezoelectric materials which have been used in micromechanical resonators.

FIG. 9a shows an equivalent electrical circuit of the micromechanical resonator 200 according to an example embodiment and FIG. 9b shows an equivalent circuit of a capacitive piezo resonator. In FIGS. 9a and 9b the capacitances $C_{g1}$, $C_{p1}$, $C_{g2}$ represent the capacitances at the input section, between the first input electrode 202 and the graphene foil 210, across the graphene foil 210, and between the graphene foil 210 and the second input electrode 202, respectively. The capacitances $C_{g3}$, $C_{p2}$, $C_{g4}$ represent the capacitances at the output section, between the first output electrode 206 and the graphene foil 210, across the graphene foil 210, and between the graphene foil 210 and the second output electrode 208, respectively. The coefficient $\eta_{drive}$ models how efficiently the energy in the electrical domain as a voltage input can be transduced into mechanical domain as a force driving the resonator to vibration. The coefficient $\eta_{sense}$ models how efficiently the energy in the mechanical domain as a displacement can be transduced into electrical domain as a current output.

In the following some example implementations of apparatuses utilizing the micromechanical resonator will be described in more detail.

Figure 4A:
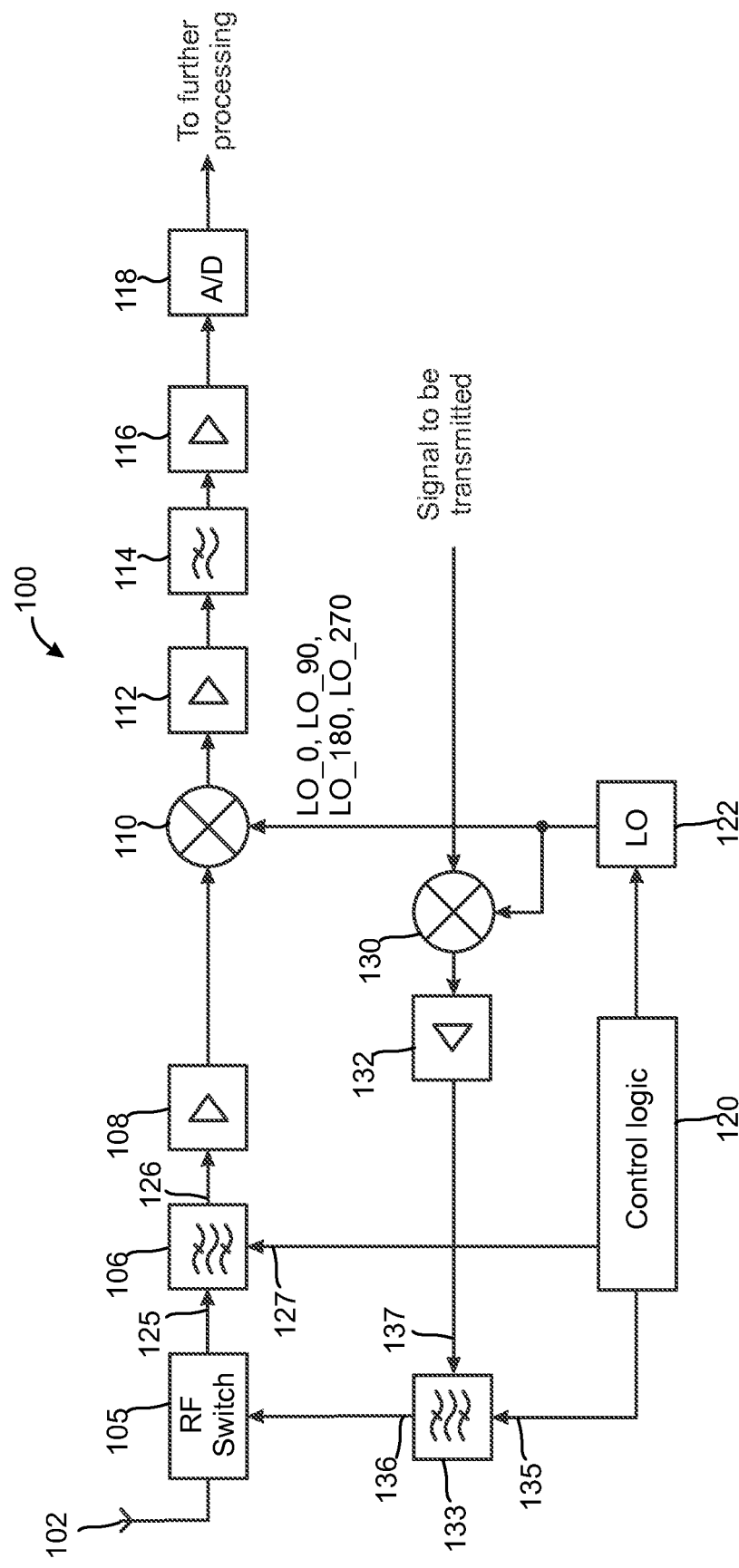
FIG. 4a shows a block diagram of RF and IF elements of a transceiver according to an example embodiment.

FIG. 4a shows a block diagram of radio frequency (RF) and intermediate frequency (IF) elements of an apparatus 100 according to an example embodiment. In this non-limiting example embodiment the apparatus 100 comprises a transmitter and a receiver. This kind of apparatus may also be called as a transceiver. However, the micromechanical resonator may also be embodied in devices comprising only a receiver or only a transmitter.

The receiver converts a received radio signal first to the intermediate frequency and then to a baseband. In some other embodiments the intermediate frequency part is not needed wherein such receivers, which may also be called as direct-conversion receivers, convert a received radio signal directly to the baseband.

In the example embodiment of FIG. 4a, the apparatus comprises an antenna 102 for receiving RF signals. The antenna 102 is connected with a radio frequency switch (RF switch) 105 which may be used to switch the antenna 102 with the receiver section, when receiving radio frequency signals, or to the transmitter section, when transmitting radio frequency signals. In some embodiments there may be separate antennas for the receiver and the transmitter wherein the RF switch 105 may not be needed or the component 105 may be a component performing a duplexing between the TX and RX frequencies in an FDD (Frequency Division Duplex) mode.

The RF switch 105 is connected to an input 125 of a first bandpass filter 106 for filtering received RF signals to eliminate or attenuate signals which are outside the desired frequency range of the RF signals. The filtered signals may be output 126 to a first amplifier 108 for amplifying the signals. The first amplifier 108 may be a low-noise amplifier (LNA) or another kind of amplifier suitable for amplifying RF signals. The amplified RF signals may be converted to intermediate signals (IF) or directly to bandbass signals by mixing the RF signals with one or more local oscillator signals LO_0, LO_90, LO_180, LO_270 from the same local oscillator 122 or from another local oscillator. The bandbass signals may be amplified by a second amplifier 112, low pass filtered by a lowpass filter 114 and again amplified by a third amplifier 116. The bandpass signals, which may be regarded as analogue signals at the output of the third amplifier 116, may be converted to digital representations (e.g. samples) by an analogue-to-digital converter 118 so that the signals may be digitally processed in further processing steps. The further processing steps are not described in more detail here but may comprise control signal processing such as call control processing, audio signal processing, video signal processing, etc.

The bandpass of the first bandpass filter 106 may be adjusted by supplying a bias voltage at the input 127 of the first bandpass filter 106. The bias voltage is, for example, a DC voltage (direct current voltage) the level of which may at least partially define the bandpass of the first bandpass filter 106. The control logic 120 may have parameters for the relationship between the bias voltage and the bandpass. These parameters may have been predetermined e.g. by measurements or by some other appropriate way. The control logic 120 also has information the band the receiver should be tuned to so that the bandpass of the first bandpass filter 106 may be adjusted to the desired receiving band.

In some embodiments the apparatus 100 may be designed to operate in more than one communication system wherein the frequency bands used by the communication systems may vary. For example, the frequency bands which the apparatus 100 should be able to utilize may be located near 900 MHz, near 1800 MHz, and near 2500 MHz, or even at higher frequencies, e.g. up to about 5 GHz. Thus, the control logic 120 may be able to determine the correct bias voltages for each of the frequency bands.

In some embodiments the analogue-to-digital conversion may be performed at an earlier stage of the receiver, for example in the front end wherein the filtered analogue radio frequency signals may be converted to digital representations (e.g. samples), wherein the other stages of the receiver may operate using the digital representations of the received signals.

It should be noted here that in some embodiments the baseband signals may include two quadrature phase signals I (In-phase) and Q (Quadrature phase), wherein the baseband section 112-118 may include separate signal processing paths for these two signals. In that case the local oscillator 122 would provide four local oscillator signals LO_0, LO_90, LO_180, LO_270 having different phase shifts (i.e. 0 degrees, 90 degrees, 180 degrees and 270 degrees).

FIG. 4a also depicts a part of a transmitter of the apparatus. A signal to be transmitted is input to the mixer 130 of the transmitter in which the signal is mixed with the local oscillator signal from the local oscillator 122. The mixing result is amplified by an amplifier 132 and band bass filtered by a second band bass filter 133 so that the signals at the correct transmitting frequency may be connected via the RF switch 105 to the antenna 102 or, in some embodiments, to a separate transmitting antenna (not shown).

Figure 4C:
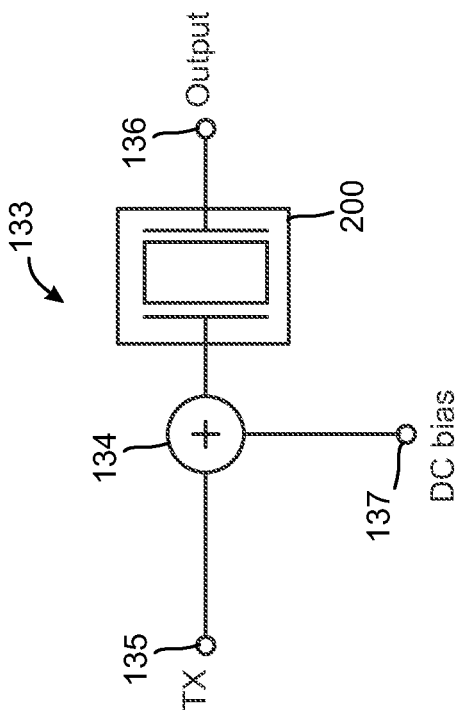
FIGS. 4b and 4c show a simplified block diagram of a first and a second bandpass filter according to an example embodiment.
Figure 4E:
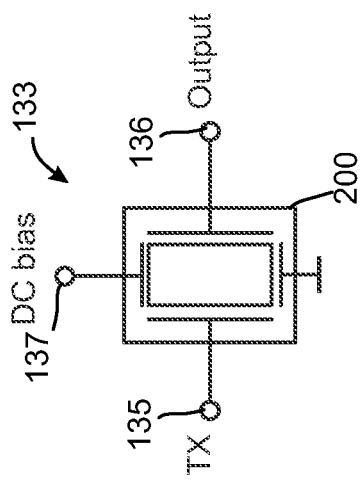
FIGS. 4d and 4e show a simplified block diagram of the first and the second bandpass filter according to another example embodiment.
Figure 4B:
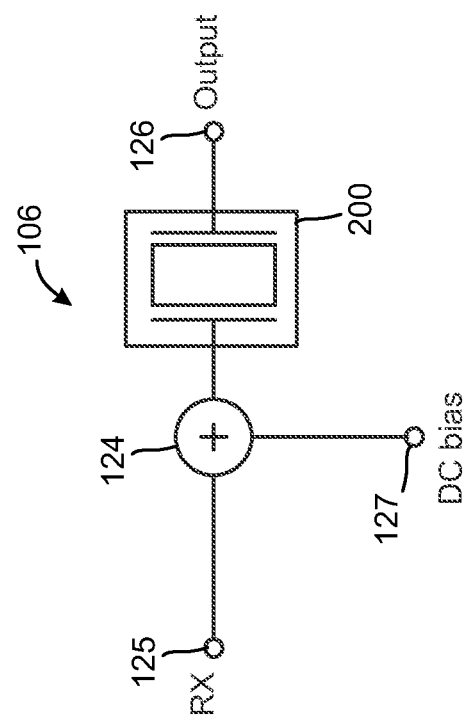

FIG. 4b depicts a simplified block diagram of the first band pass filter 106 comprising the micromechanical resonator 200. In this embodiment the first band pass filter 106 also comprises an input 125 for receiving RF signals, a bias input 127 for receiving a bias voltage, a combiner 124 for combining the RF signal and the bias voltage, and an output 126 for outputting the filtered RF signals. The combiner 124 may be any appropriate electrical component or circuit in which the RF signals and the bias voltage may be combined to provide the bias voltage as well as the RF signal to the input electrodes 202, 204 of the micromechanical resonator. It should be mentioned here that the output of the combiner 124 may be connected to one of the input electrodes 202, 204 and the other input electrode 204, 202 may be grounded i.e. connected to 0 V. FIG. 4c depicts a simplified block diagram of the second band pass filter 133 comprising the micromechanical resonator 200. In this embodiment the second band pass filter 133 is similar to the first band pass filter 106 but may also be different from the first band pass filter. There is an input 135 for receiving RF signals, a bias input 137 for receiving a bias voltage, a combiner 134 for combining the RF signal and the bias voltage, and an output 136 for outputting the filtered RF signals.

Figure 4D:
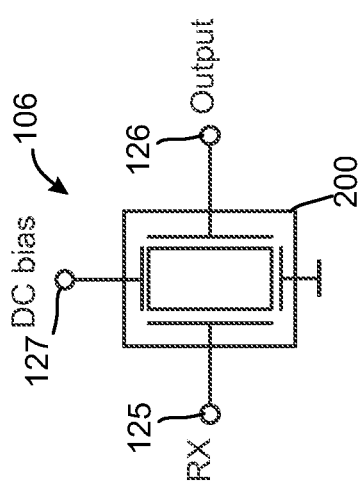

FIGS. 4d and 4e illustrate another embodiment of the first bandpass filter 106 and the second bandpass filter 133, respectively. In this embodiment the micromechanical resonator 200 comprises bias electrodes for receiving bias voltage. Hence, the RF signal and the bias voltage may be kept separate from each other and the combiner 124, 134 is not needed in the bandpass filters 106, 133.

FIG. 10 illustrates an example of bias voltage-bandpass frequency relationship of the micromechanical resonator.

As a conclusion, there is provided a bandpass tuning circuitry including a micromechanical resonator having a piezoelectric graphene foil which may be implemented e.g. in an integrated circuit (IC) with fairly large tuning ratio.

Many embodiments of the present invention may be implemented in software defined radios in which the tuning of the front end is at least partially performed by software.

Figure 2:
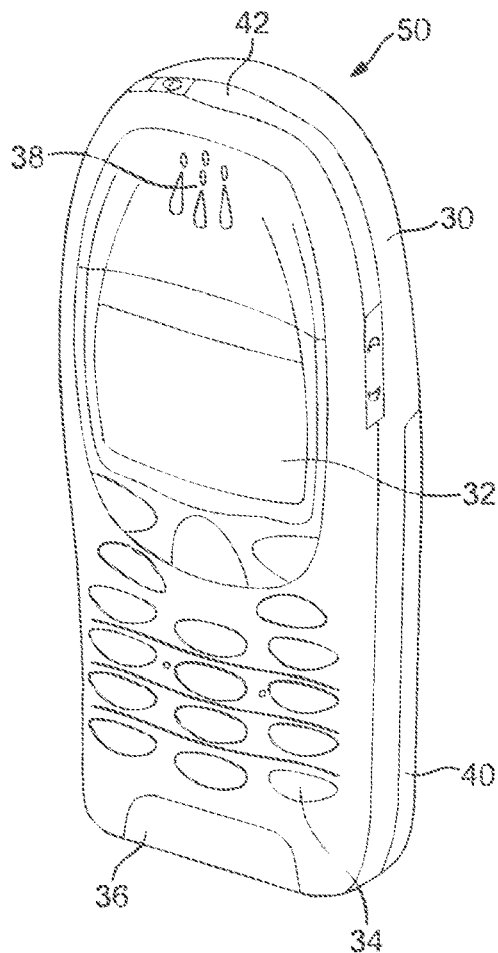
FIG. 2 shows an apparatus according to an example embodiment.

The following describes in further detail suitable apparatus and possible mechanisms for implementing the embodiments of the invention. In this regard reference is first made to FIG. 1 which shows a schematic block diagram of an exemplary apparatus or electronic device 50 depicted in FIG. 2, which may incorporate a receiver front end according to an embodiment of the invention.

The electronic device 50 may for example be a mobile terminal or user equipment of a wireless communication system. However, it would be appreciated that embodiments of the invention may be implemented within any electronic device or apparatus which may require reception of radio frequency signals.

The apparatus 50 may comprise a housing 30 for incorporating and protecting the device. The apparatus 50 further may comprise a display 32 in the form of a liquid crystal display. In other embodiments of the invention the display may be any suitable display technology suitable to display an image or video. The apparatus 50 may further comprise a keypad 34. In other embodiments of the invention any suitable data or user interface mechanism may be employed. For example the user interface may be implemented as a virtual keyboard or data entry system as part of a touch-sensitive display. The apparatus may comprise a microphone 36 or any suitable audio input which may be a digital or analogue signal input. The apparatus 50 may further comprise an audio output device which in embodiments of the invention may be any one of: an earpiece 38, speaker, or an analogue audio or digital audio output connection. The apparatus 50 may also comprise a battery 40 (or in other embodiments of the invention the device may be powered by any suitable mobile energy device such as solar cell, fuel cell or clockwork generator). The apparatus may further comprise an infrared port 42 for short range line of sight communication to other devices. In other embodiments the apparatus 50 may further comprise any suitable short range communication solution such as for example a Bluetooth wireless connection or a USB/firewire wired connection.

The apparatus 50 may comprise a controller 56 or processor for controlling the apparatus 50. The controller 56 may be connected to memory 58 which in embodiments of the invention may store both data and/or may also store instructions for implementation on the controller 56. The controller 56 may further be connected to codec circuitry 54 suitable for carrying out coding and decoding of audio and/or video data or assisting in coding and decoding carried out by the controller 56.

The apparatus 50 may further comprise a card reader 48 and a smart card 46, for example a UICC and UICC reader for providing user information and being suitable for providing authentication information for authentication and authorization of the user at a network.

The apparatus 50 may comprise radio interface circuitry 52 connected to the controller and suitable for generating wireless communication signals for example for communication with a cellular communications network, a wireless communications system or a wireless local area network. The apparatus 50 may further comprise an antenna 102 connected to the radio interface circuitry 52 for transmitting radio frequency signals generated at the radio interface circuitry 52 to other apparatus(es) and for receiving radio frequency signals from other apparatus(es).

In some embodiments of the invention, the apparatus 50 comprises a camera capable of recording or detecting imaging.

Figure 3:
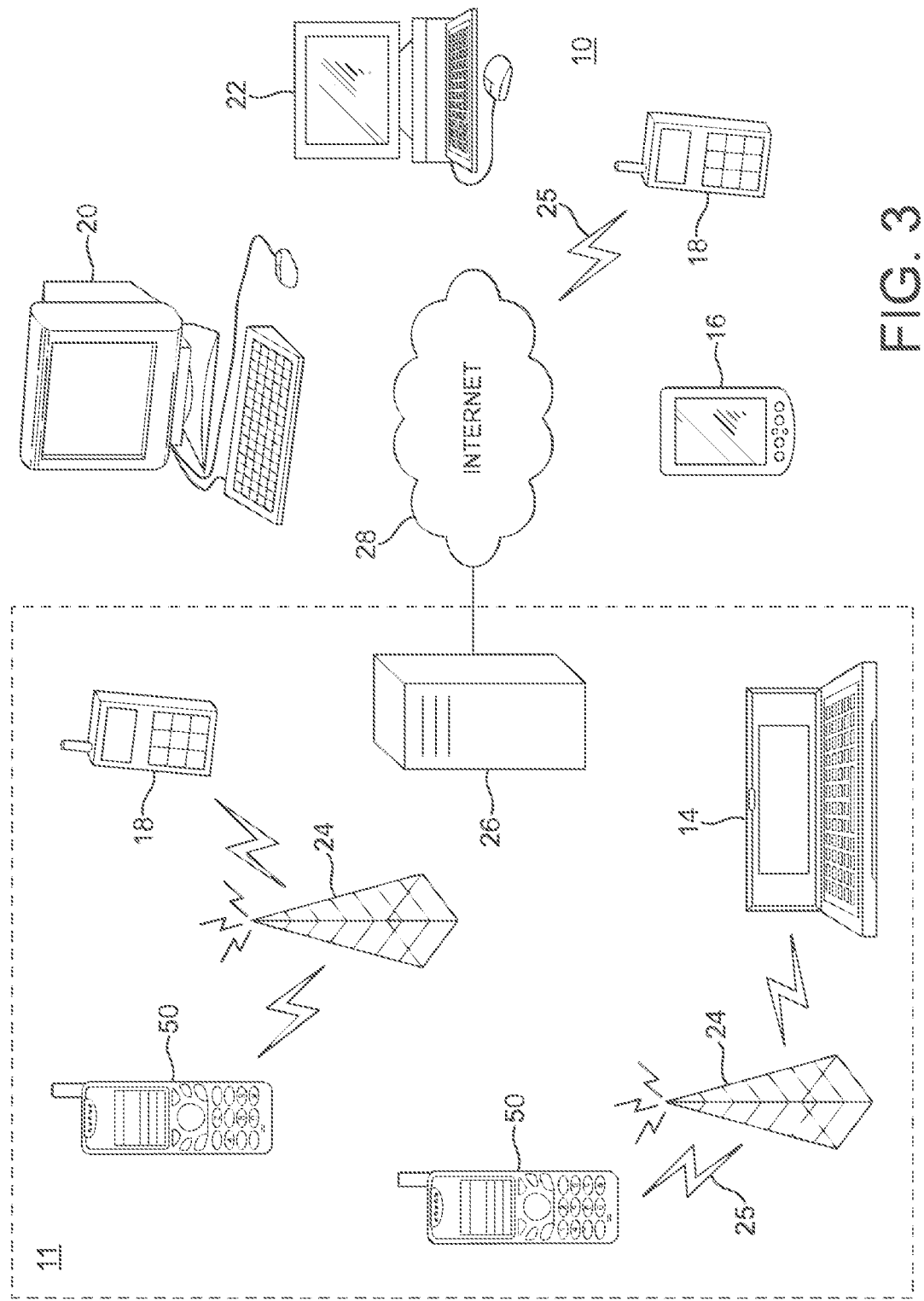
FIG. 3 shows an example of an arrangement for wireless communication comprising a plurality of apparatuses, networks and network elements.

With respect to FIG. 3, an example of a system within which embodiments of the present invention can be utilized is shown. The system 10 comprises multiple communication devices which can communicate through one or more networks. The system 10 may comprise any combination of wired and/or wireless networks including, but not limited to a wireless cellular telephone network (such as a GSM, UMTS, CDMA network etc.), a wireless local area network (WLAN) such as defined by any of the IEEE 802.x standards, a Bluetooth personal area network, an Ethernet local area network, a token ring local area network, a wide area network, and the Internet.

The system 10 may include both wired and wireless communication devices or apparatus 50 suitable for implementing embodiments of the invention.

For example, the system shown in FIG. 3 shows a mobile telephone network 11 and a representation of the internet 28. Connectivity to the internet 28 may include, but is not limited to, long range wireless connections, short range wireless connections, and various wired connections including, but not limited to, telephone lines, cable lines, power lines, and similar communication pathways.

The example communication devices shown in the system 10 may include, but are not limited to, an electronic device or apparatus 50, a combination of a personal digital assistant (PDA) and a mobile telephone 14, a PDA 16, an integrated messaging device (IMD) 18, a desktop computer 20, a notebook computer 22. The apparatus 50 may be stationary or mobile when carried by an individual who is moving. The apparatus 50 may also be located in a mode of transport including, but not limited to, a car, a truck, a taxi, a bus, a train, a boat, an airplane, a bicycle, a motorcycle or any similar suitable mode of transport.

Some or further apparatus may send and receive calls and messages and communicate with service providers through a wireless connection 25 to a base station 24. The base station 24 may be connected to a network server 26 that allows communication between the mobile telephone network 11 and the internet 28. The system may include additional communication devices and communication devices of various types.

The communication devices may communicate using various transmission technologies including, but not limited to, code division multiple access (CDMA), global systems for mobile communications (GSM), universal mobile telecommunications system (UMTS), time divisional multiple access (TDMA), frequency division multiple access (FDMA), transmission control protocol-internet protocol (TCP-IP), short messaging service (SMS), multimedia messaging service (MMS), email, instant messaging service (IMS), Bluetooth, IEEE 802.11 and any similar wireless communication technology. A communications device involved in implementing various embodiments of the present invention may communicate using various media including, but not limited to, radio, infrared, laser, cable connections, and any suitable connection.

Although the above examples describe embodiments of the invention operating within a transceiver within an electronic device, it would be appreciated that the invention as described below may be implemented as part of any apparatus comprising a receiver and/or a transmitter. Thus, for example, embodiments of the invention may be implemented in a wireless communication device.

Thus, user equipment may comprise a transceiver such as those described in embodiments of the invention above. It shall be appreciated that the term user equipment is intended to cover any suitable type of wireless communication device, such as mobile telephones, portable data processing devices or portable web browsers.

Furthermore elements of a public land mobile network (PLMN) may also comprise transceivers as described above.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this invention may be partly implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory may be of any type suitable to the local technical environment and may be implemented using any suitable data storage technology, such as semiconductor based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs) and processors based on multi core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

In the following some examples will be provided.

According to a first example, there is provided an apparatus comprising:

a first input electrode and a second input electrode for receiving radio frequency signals;

a graphene foil for converting at least part of the radio frequency signals into mechanical energy;

dielectric support elements to support the graphene foil and to space apart the input electrodes and the graphene foil;

wherein the graphene foil has piezoelectric properties.

In some embodiments of the apparatus the dielectric support elements are located between the input electrodes and the graphene foil.

In some embodiments of the apparatus the dielectric support elements produce pressure on the graphene foil In some embodiments of the apparatus the first input electrode and the second input electrode are also adapted to receive a bias voltage for tuning a resonance frequency of the apparatus.

In some embodiments the apparatus further comprises bias electrodes for receiving a bias voltage for tuning a resonance frequency of the apparatus.

In some embodiments of the apparatus the first input electrode and the second input electrode are separate from the dielectric support elements.

In some embodiments of the apparatus the first input electrode and the second input electrode are adapted to receive a bias voltage for tuning a resonance frequency of the apparatus.

In some embodiments the apparatus is adapted to convert only radio frequency signals having frequency near a resonance frequency of the apparatus into mechanical energy.

In some embodiments the apparatus further comprises a first output electrode and a second output electrode for converting at least part of the mechanical energy into electric signals and for outputting the electric signals.

In some embodiments the apparatus further comprise dielectric shields between the graphene foil and the electrodes to prevent the graphene foil touching the electrodes when converting radio frequency signals into mechanical energy.

In some embodiments the apparatus further comprises a pair of dielectric support elements at two opposing edges of the graphene foil, wherein the graphene foil remain unsupported on the area between the pairs of dielectric supporting elements.

In some embodiments the apparatus further comprises the dielectric support elements only at one edge of the graphene foil, wherein other edges of the graphene foil remain unsupported.

In some embodiments of the apparatus the shape of the graphene foil in one dimension is one of the following:

a rectangle;

a circle;

a ring.

According to a second example there is provided a method comprising:

receiving radio frequency signals by input electrodes of an apparatus;
providing a bias voltage to the apparatus for tuning the resonance frequency of the apparatus; and
converting at least part of the radio frequency signals into mechanical energy by a graphene foil having piezoelectric properties.

In some embodiments the method further comprises:
selecting a frequency band;
determining the value of the bias voltage on the basis of the selected frequency band for tuning a bandpass of the apparatus to correspond with the selected frequency band.

In some embodiments the method further comprises receiving the bias voltage by using bias electrodes separate from the input electrodes.

In some embodiments the method further comprises converting at least part of the mechanical energy into electric signals; and outputting the electric signals.

According to a third example, there is provided an apparatus comprising:
means for receiving radio frequency signals;
means for using a graphene foil for converting at least part of the radio frequency signals into mechanical energy;
means for supporting the graphene foil and for spacing apart the input electrodes and the graphene foil;
means for providing piezoelectric properties to the graphene foil.

In some embodiments the apparatus further comprises means for producing pressure on the graphene foil.

In some embodiments the apparatus further comprises means for receiving a bias voltage for tuning a resonance frequency of the apparatus.

According to a fourth example, there is provided an apparatus comprising
a control element for selecting a frequency band for reception;
an antenna for receiving radio frequency signals;
a bandpass filter for filtering radio frequency signals within the selected frequency band for further processing, the bandpass filter comprising a micromechanical resonator having:
a first input electrode and a second input electrode for receiving the radio frequency signals from the antenna;
a graphene foil having piezoelectric properties for converting at least part of the radio frequency signals into mechanical energy;
dielectric support elements to support the graphene foil and to space apart the input electrodes and the graphene foil;
wherein the apparatus is adapted to provide a bias voltage to the micromechanical resonator for tuning the resonance frequency of the micromechanical resonator to correspond with the selected frequency band.

The invention claimed is:

1. An apparatus comprising:
a first input electrode configured to receive radio frequency signals;
a graphene foil configured to convert at least part of the radio frequency signals into mechanical energy; and
at least one dielectric support element configured to support the graphene foil and to space apart the at least one input electrode and the graphene foil;
wherein the graphene foil has piezoelectric properties, wherein the graphene foil comprises a resonance frequency and is configured as a band-pass filter to pass through the radio frequency signals within a predetermined range of the resonance frequency for conversion into mechanical energy.

2. The apparatus according to claim 1, further comprising a second input electrode, wherein the graphene foil is adapted to convert an electric field produced by the radio frequency signal between the first input electrode and the second input electrode to mechanical energy.

3. The apparatus according to claim 2, wherein the at least one dielectric support element is located between the first input electrode and the graphene foil; and another dielectric support element is located between the second input electrode and the graphene foil.

4. The apparatus according to claim 2, wherein the first input electrode and the second input electrode are separate from the dielectric support elements.

5. The apparatus according to claim 3, wherein the dielectric support elements are adapted to produce pressure on the graphene foil.

6. The apparatus according to claim 1, wherein the first input electrode is adapted to receive a bias voltage for tuning a resonance frequency of the apparatus.

7. The apparatus according to claim 1, further comprising a first bias electrode for receiving a bias voltage for tuning a resonance frequency of the apparatus.

8. The apparatus according to claim 7, further comprising a second bias electrode, wherein the first bias electrode and the second bias electrode are adapted to receive a bias voltage between the first bias electrode and the second bias electrode for tuning a resonance frequency of the apparatus.

9. The apparatus according to claim 1, further comprising a first output electrode for converting at least part of the mechanical energy into electric signals or for outputting the electric signals.

10. The apparatus according to claim 9, further comprising a second output electrode, wherein the graphene foil is adapted to convert the mechanical energy into an electric field between the first output electrode and the second output electrode.

11. A method comprising:
providing at least one input electrode configured to receive radio frequency signals;
providing a graphene foil configured to convert at least part of the radio frequency signals into mechanical energy; and
providing at least one dielectric support element configured to support the graphene foil and spacing apart the at least one input electrode and the graphene foil;
wherein the graphene foil has piezoelectric properties, wherein the graphene foil comprises a resonance frequency and is configured as a band-pass filter to pass through the radio frequency signals within a predetermined range of the resonance frequency for conversion into mechanical energy.

12. The method according to claim 11, wherein providing at least one input electrode comprises providing a first input electrode and a second input electrode, wherein the graphene foil converts an electric field produced by the radio frequency signal between the first input electrode and the second input electrode to mechanical energy.

13. The method according to claim 12, further comprising:
locating the at least one dielectric support element between the first input electrode and the graphene foil; and
locating another dielectric support element between the second input electrode and the graphene foil.

14. The method according to claim 12, further comprising separating the first input electrode and the second input electrode from the dielectric support elements.

15. The method according to claim 13, further comprising producing pressure on the graphene foil by the dielectric support elements.

16. The method according to claim 11, further comprising receiving a bias voltage at the at least one input electrode for tuning a resonance frequency of the apparatus.

17. The method according to claim 11, further comprising receiving a bias voltage at least one bias electrode for tuning a resonance frequency of the apparatus.

18. The method according to claim 11, further comprising providing at least one output electrode for converting at least part of the mechanical energy into electric signals and for outputting the electric signals.

19. The method according to claim 18, wherein providing at least one output electrode comprises providing a first output electrode and a second output electrode, wherein the graphene foil converts the mechanical energy into an electric field between the first output electrode and the second output electrode.

20. An apparatus comprising:
- a control element configured to select a frequency band for reception;
- an antenna configured to receive radio frequency signals;
- a band-pass filter configured to filter radio frequency signals within the selected frequency band for further processing, the band-pass filter comprising a micromechanical resonator, wherein the micromechanical resonator comprises:
- at least one input electrode configured to receive the radio frequency signals from the antenna;
- a graphene foil having piezoelectric properties for converting at least part of the radio frequency signals into mechanical energy, wherein the graphene foil comprises a resonance frequency and is configured as a band-pass filter to pass through the radio frequency signals within a predetermined range of the resonance frequency for conversion into mechanical energy; and
- at least one dielectric support element configured to support the graphene foil and to space apart the at least one input electrode and the graphene foil;
- wherein the apparatus is adapted to provide a bias voltage to the micromechanical resonator for tuning the resonance frequency of the micromechanical resonator to correspond with the selected frequency band.

\* \* \* \* \*